United States Patent

Itoh et al.

[11] Patent Number: 5,923,679
[45] Date of Patent: Jul. 13, 1999

[54] ERROR CORRECTION ENCODER, ERROR CORRECTION DECODER, AND COMMUNICATION SYSTEM

[75] Inventors: Katsutoshi Itoh; Kenichiro Hosoda, both of Tokyo, Japan

[73] Assignee: Oki Electric Industry Co., Ltd., Tokyo, Japan

[21] Appl. No.: 08/877,327

[22] PCT Filed: Oct. 15, 1996

[86] PCT No.: PCT/JP96/02985

§ 371 Date: Jun. 17, 1997

§ 102(e) Date: Jun. 17, 1997

[87] PCT Pub. No.: WO97/15120

PCT Pub. Date: Apr. 24, 1997

[30] Foreign Application Priority Data

Oct. 17, 1995 [JP] Japan .................................. 7-268411

[51] Int. Cl.[6] .................................................. H03M 13/00
[52] U.S. Cl. ............................ 371/37.01; 371/37.02; 371/37.7; 371/37.08; 371/43.7; 370/317; 370/326; 395/185.05; 395/200.77
[58] Field of Search ........................... 371/37.01, 37.4, 371/39.1, 43.6, 37.5, 38.1, 37.41, 37.2, 2.2, 30, 37.02, 37.07, 37.08, 43.2, 43.7, 50.1; 375/347; 370/326, 317, 342; 395/185.05, 200.77

[56] References Cited

U.S. PATENT DOCUMENTS

4,306,305 12/1981 Doi et al. ................................... 371/38
4,429,390 1/1984 Sonoda et al. ............................ 371/40
4,747,104 5/1988 Piret ......................................... 371/39

Primary Examiner—Reba I. Elmore
Assistant Examiner—McDieunel Marc
Attorney, Agent, or Firm—Rabin & Champagne, P.C.

[57] ABSTRACT

Error detection and correction capability is improved compared to the conventional art, without lowering the transmission efficiency. When a class dividing circuit 101 is supplied with the information code from a voice encoder, according to the definition assigned to the information code by the class divider extremely important class 0 information code is supplied to a CRC calculation circuit 102 and a block coding circuit 103, the next most important class 1 information code is supplied to a block coding circuit 105, and the next most important class 2 information code is supplied directly to an interleaving circuit 107. The CRC calculating circuit 102 obtains error correction information for the class 0 information code supplied from the class dividing circuit 101, generates data with error detection information appended thereto, and supplies it to a class 0 block coding circuit 103. The class 0 block coding circuit 103 carries out block coding from the data having error detection information appended and class 0 data.

11 Claims, 9 Drawing Sheets

ERROR CORRECTION ENCODER, ERROR CORRECTION DECODER, AND COMMUNICATION SYSTEM

FIELD OF THE INVENTION

The present invention relates to an error correction encoder, error correction decoder and communication system, for example, comprising further improvements to the transmission quality when applied to a system communicating via a transmission path with inferior transmission path characteristics.

BACKGROUND ART

In the field of information transmission, error correction decoding is generally used in order to reduce the influence of errors occurring in a transmission path as much as possible, and to carry out highly reliable information transmission. This error correction decoding controls errors by appending redundancy code to the information code. In an actual signal transmission system, because the amount of redundancy code that can be appended is limited by such factors as the scale of the hardware etc., in the case where transmission data errors have occurred exceeding the error correcting capability possessed by redundancy code, erroneous data will be received. To cope with this type of situation, a method has been adopted where error detection codes such as CRC (Cyclic redundancy check) are appended to information that is not permitted to have transmission errors, and the existence of uncorrectable transmission errors is detected at the receive signal side.

However, an inferior transmission path, such as is often the case in radio communication, the possibility of the occurrence of transmission errors beyond the correction capability possessed by the code is comparatively high, and there is a need for more powerful error correction codes. On the other hand, in order to improve the error correcting capability it is generally necessary to increase the redundancy code included in the code, but this is not possible in a signal transmission system in which the transmission efficiency can not be sacrificed.

SUMMARY OF THE INVENTION

Accordingly, an object of the invention is to provide an error correction encoder, error correction decoder and communication system that can improve error detection and error correction capability in the transmission of extremely important information or signals (for example, voice, image, control information, etc.) without lowering the transmission efficiency.

Namely, the error correction encoding device of the present invention is provided with input information extraction means for extracting and outputting extremely important information (for example, voice routing information, power information, etc.) or input information having an extremely high level of priority (for example, information having high urgency or immediacy), from within input information (for example, voice encoding data) that is to be subject to error correction, and error correction encoding means for obtaining error detection information for every specified bit length of input information extracted by the input information extraction means, and carrying out block coding by combining the error detection information and input information of a specified bit length, carrying out encoding processing using error correction code for block data obtained from the block coding and outputting error correction encoding data.

By adopting this type of configuration, error detection information is obtained for information within the input information which is extremely urgent or has extremely high priority and appended to block coded information, and error correction encoding is carried out using error correction code for the block data and outputted. Thus, it is possible to transmit extremely urgent information or information having extremely high priority even through an inferior radio communication path, by applying sufficient countermeasures for transmission errors. Also from the point of view of transmission efficiency, since information for error detection is only appended to extremely important information, there is no danger that the transmission efficiency will be lowered excessively.

Further, an error correction decoder of the present invention comprises decode candidate estimating means, for estimating at least two decode candidate data that have been estimated as seeming extremely reliable and have been obtained as a result of error correction decoding processing for encoded data of at least one block by carrying out error correction decoding processing based on error correction encoding data for every block from an error correction encoder, and valid decode candidate decision means for determining whether or not there is an error by performing error checking with respect to combined decode candidate data formed by combining these decode candidate data, and determining error candidate data with no errors as valid decode data.

With this type of construction, by estimating at least two decode candidate data estimated as seeming extremely reliable as a result of error correction decoding processing for error correction encoding data of at least one block, and performing error checking with respect to combined decode data that has no errors as valid decode data, it is possible to demonstrate sufficient error correction efficiency with respect to transmission path errors, even for a receive signal received from an inferior transmission path, and to reclaim and output apparently reliable input information.

Further, from the point of view of transmission efficiency also, only error detection information is appended to extremely important input information subject to error detection, or input information having extremely high priority, and nothing else is appended, so there is no danger of the transmission efficiency being excessively lowered.

Accordingly, by using the above described error correction encoder and error correction decoder, it is possible to improve error detection and error correction capabilities, compared to the prior art, for the transmission of extremely important information or information that has extremely high priority, even when transmitted via an inferior transmission path, without lowering the transmission efficiency.

BEST MODE OF CARRYING OUT THE INVENTION

Preferred embodiments of the present invention will now be described using the attached diagrams.

Embodiment 1

In a first embodiment of the present invention, encoding is carried out differently for an information code including information applicable to error detection and an information code that does not include information applicable to error detection. At the decoding side, transmitted transmission code strings having a high probability are repeatedly encoded as candidates, and by setting decoding results from among the plurality of candidates as a final decoding result using error detection, it is possible to provide correction which is improved compared to the error correction capability possessed by the code itself. Specifically, in order to use receive code decoding without the use of receive side error detection, an error correction encoder is constructed so that error detection codes appended to an information code list are encoded by separating information code to which error detection is applied at the time of decoding and information code for which error detection is not performed. Further, the encoder is constructed such that transmission code to which error correction is applied is encoded including an encoding block by combining a transmission code that is not subject to error detection with an information code that is subject to error detection. Still further, the error correction encoder multiply encodes transmission code strings that can be transmitted, checks the validity of decode results using error detection information included in the decoded transmission signal, and sets a decoded result recognized as valid as a final decode result.

In this embodiment, the present invention will be described as an example in a case applied to a digital cellular system of the North American TDMA system. As specifications and standards for the North American TDMA system, IS-136 is recommended, but if IS-136 is used, transmission parameters using VSELP (Vector Sum code-Excited Linear Prediction) are class divided in response to degree of importance. Extremely important parameters are power information and LPC coefficients (voice path coefficients). In this embodiment, an example applied to a digital portable telephone is shown, and in the use of a portable telephone, because it is impossible to transmit redundancy code in order to perform error correction for all voice information, it is preferable to only apply error correction code to information which is important in preserving the voice quality. For instance, for output data of a voice encoder N class 0 bits of parameters that are extremely important to the voice listening are set to class 0. Specifically, the above mentioned power information and LPC coefficients (voice path coefficients) etc. are set to most important class 0. The next most important N class 1 bits are set to class 1. Further, other N class 2 bits are classified as class 2. Error correction code is then applied to only class 0 data and class 1 data. In the present invention, the error correction capability can also be improved particularly for the extremely important class 0 data.

Figure 1:
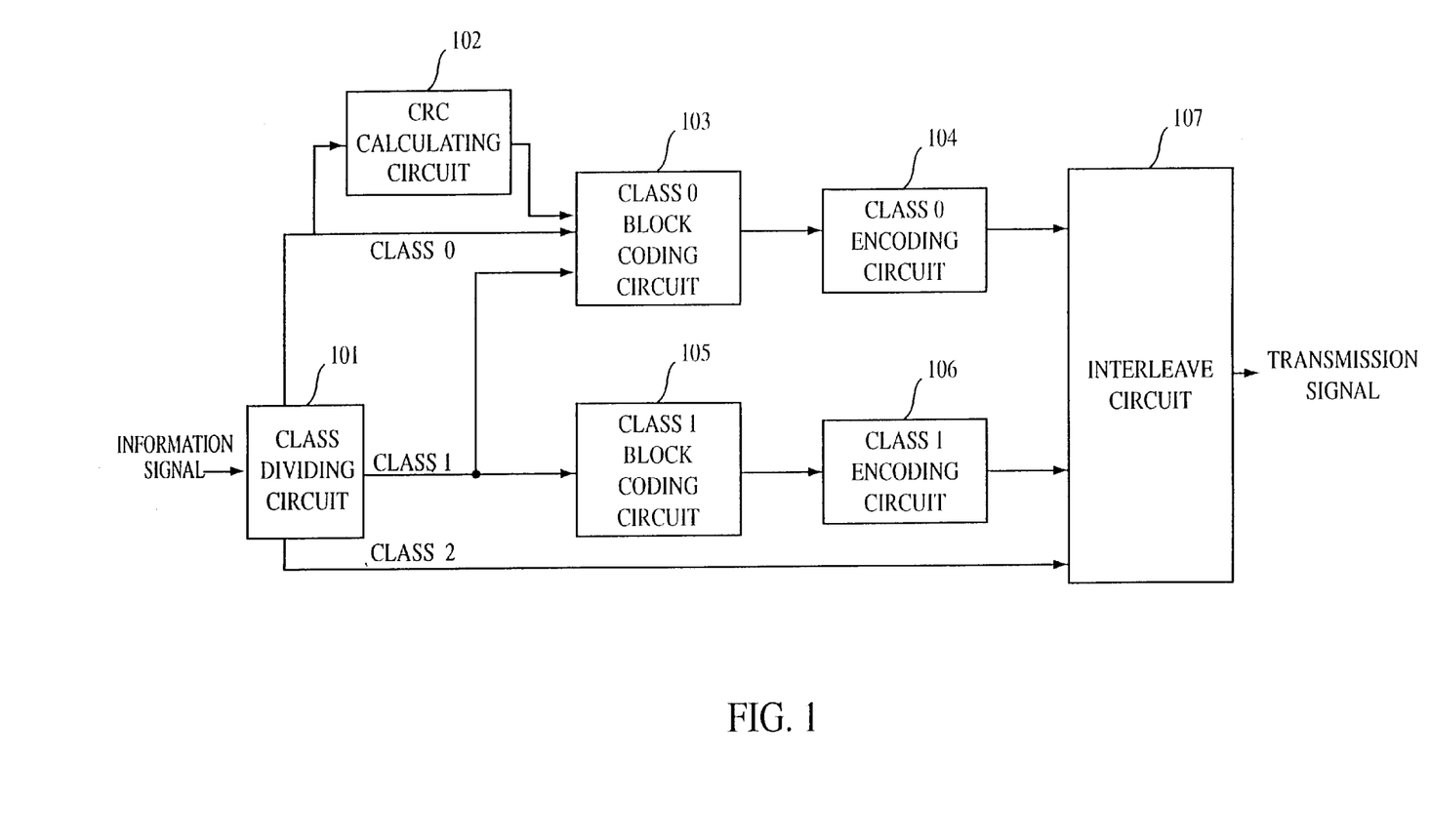
FIG. 1 is a functional block diagram of an error correction encoder of a first embodiment of the present invention.

FIG. 1 is a functional block diagram of a transmission side error correction encoder. In FIG. 1, the error correction encoder is constructed of a class dividing circuit 101, a CRC calculating circuit 102, a class 0 block coding circuit 103, a class 0 encoding circuit 104, a class 1 block coding circuit 105, a class 1 encoding circuit 106, and an interleave circuit 107. The construction and function of the transmission side error correction encoder will now be described. If information code is supplied, for example, from a voice encoder, the class dividing circuit 101 refers to a previously stored table so as to classify this information code according to the previously described class definitions, and then supplies class 0 information code to the CRC calculating circuit 102 and the block coding circuit 103, supplies class 1 information code to the block coding circuit 105, and supplies class 2 information code directly to the interleaving circuit 107. Here, it is also desirable to supply part of the class 1 information code to the block coding circuit 103. The CRC calculating circuit 102 requests Ncrc bit error detection information appended thereto, and supplies this data to the class 0 block coding circuit 103.

The requested error detection information will be described in more detail. In the case of being applied to the above described TDMA digital cellular system, it is desirable to use $g(X)=1+X+X^2+X^4+X^5+X^7$ as a CRC code generating polynomial g(X).

The class 0 block coding circuit 103 carries out error correction block coding from data Ntot that has had error detection information supplied from CRC calculating circuit 103 appended thereto, and from class 0 data supplied from the class dividing circuit 101. More specifically, it is divided into short blocks of k-bit units. The blocks of k-bit units divided in this way are supplied to the class 0 encoding circuit 104. The class 0 encoding circuit 104 carries out block coding for the k-bit unit block data supplied from the class 0 block coding circuit 103, and supplies the block coded data to the interleaving circuit 107. This block coding is, for example, 2-level error correctable radio type system code, and block coding is carried out using NR (Nordstrom Robinson) code capable of correcting complex errors such as random errors or burst errors occurring in a communication path, and using a code length of n=16, for example, and a number of information code symbols k=8 (or 7) to append a correction capability for transmission path errors, and class 0 block coded data is then supplied to the interleaving circuit 107.

By carrying out NR block coding in this way, it is possible to perform error correction of complex errors in a communication path at the receive side.

The class 1 block coding circuit 105 compares class 1 data supplied from the class dividing circuit 101 with the above class 0 data, and as the data has a highest degree of importance one class lower, k-bit unit block coding is carried out without appending the above described CRC information for the class 1 data, and the k-bit data is supplied to the class 1 encoding circuit 106.

The class 1 coding circuit 106 carries out block encoding of the k-bit unit block data supplied from the class 1 block coding circuit 105 using the above described NR code, for example, with a code length n=16, and a number of information symbols k=8 or 7, appends a correction capability for transmission path errors and supplies class 1 block coded data to the interleaving circuit 107.

The interleaving circuit 107 carries out bit interleaving of class 0 block coded data from the class 0 encoding circuit 104, class 1 block coded data from the class 1 encoding circuit 106, and class 2 data from the class dividing circuit 101, and supplies the data after interleaving as transmission code to a decoder, via a transmission path. The above described class 2 data is data two ranks lower than the data of the highest level of importance, and so error correction encoding is not applied.

Also, to describe the bit interleaving in more details, in the use of transfer communication etc., since a lot of errors occur in bursts, the bits are rearranged so that the errors for each block occur randomly.

Figure 2:
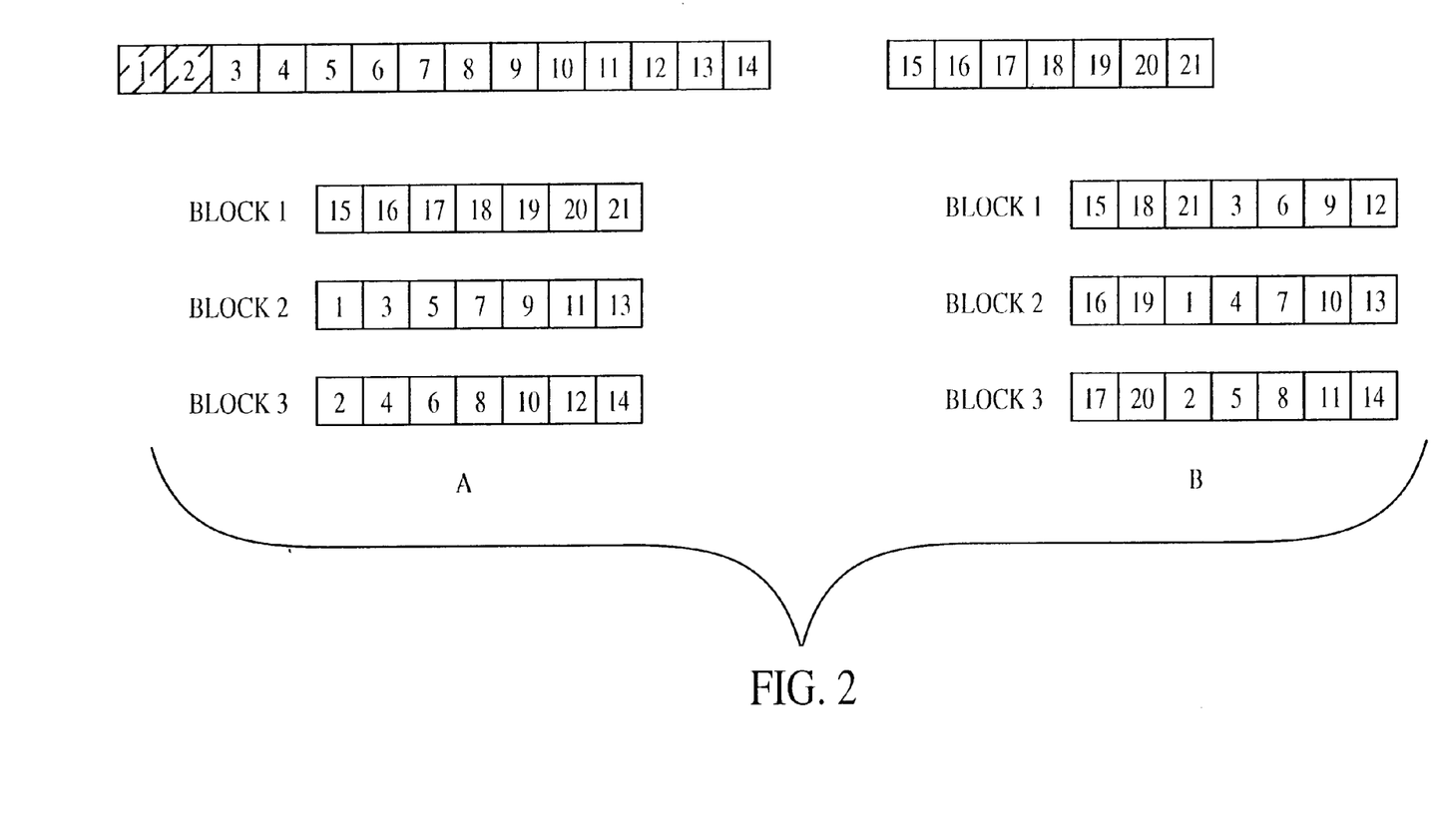
FIG. 2 is an explanatory diagram of the information code block coding of the error correction encoder of the first embodiment.

FIG. 2 is a drawing explaining in detail the block coding carried out by the above described class 0 block coding circuit 103. FIG. 2 (*a*) shows data divided from a 7 bit CRC code from the CRC calculation circuit 102 (15~21) (error detection information) and 14 bits of information code from the class dividing circuit 101 into 3 blocks of k=7 bit units. Within the 14 bits of information code, 12 bits (information code 3~14) are class 0 data and 2 bits (information code 1~2) correspond to class 1 data, and so the subject of error detection using CRC is the 12 bits (information code 3~14).

Moreover, in this block of coding, an example is shown where 7 bits of CRC code are collected together in block 1 and the 14 bits of information code are arranged in blocks 2 and 3. In other words, information codes 1, 3, 5, 7, 9, 11 and 13 are arranged in block 2, while information codes 2, 4, 6, 8, 10, 12, and 14 are arranged in block 3. In this way, block data block coded in 7 bit units is supplied to the class 0 encoding circuit 104 where it is block encoded. Since 1 or two bits of class 1 information code can be block encoded together with class 0 information code 3~14, the block coding efficiency for class 0 and class 1 can be improved.

Accordingly, by carrying out block coding for a block having centrally arranged CRC codes in this way, it is possible to carry out block coding processing simply and at high speed.

FIG. 2 (*b*) shows an example of block coding by the class 0 block encoding circuit 103, for the case where 7 bits of CRC code (15~21) and 14 bits. of information code from the class dividing circuit 101 (1~14) are block coded into 3 blocks, and the 7 bits of CRC code are dispersed and arranged among the 3 blocks.

Since among the 14 bits of information code there are 12 bits of class 0 data (information code 3~14) and 2 bits corresponding to class 1 data (information code 1~2), the subject of error detection using CRC is the 12 bits (information code 3~14).

That is, in this block coding operation, CRC code 15, 18, and 21, and information code 3, 6, 9, and 12 are arranged in block 1, CRC code 16 and 19, and information code 1, 4, 7, 10, and 13 are arranged in block 2, and CRC code 17 and 20, and information code 2, 5, 8, 11 and 14 are arranged in block 3. In this manner, block data block coded in 7 bit units is supplied to the class 0 encoding circuit 104 where block coding is performed. Also, in the above described block coding, the 7 bits of CRC code are arranged at the head of each block, and the information code is arranged after the CRC codes arranged at the head of the block.

Accordingly, in the case where information code has been block coded it is possible to arrange CRC code almost uniformly for all blocks.

Figure 3:
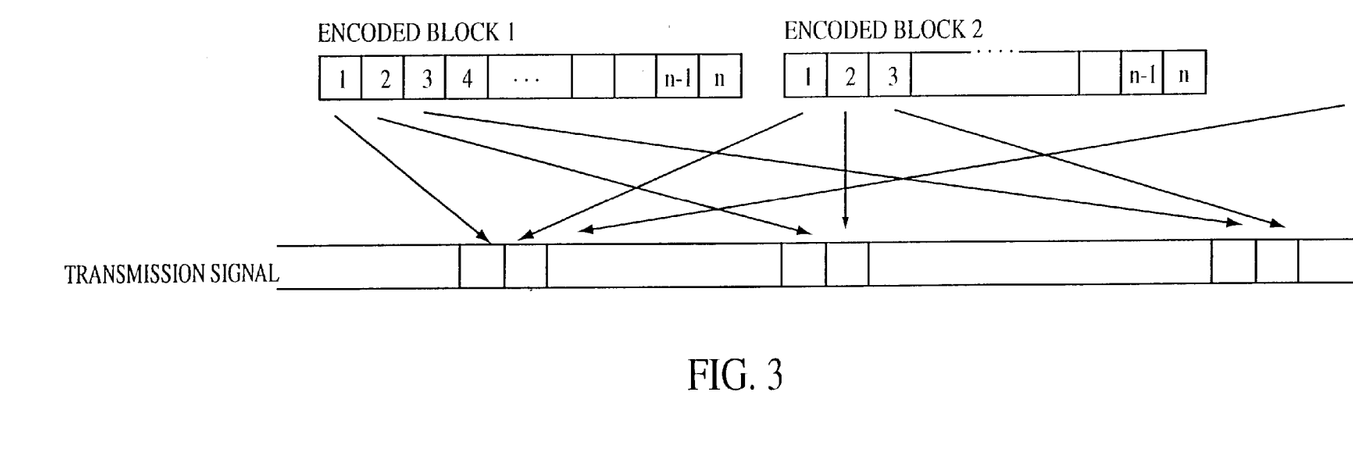
FIG. 3 is an explanatory diagram of interleaving for the error correction encoder of the first embodiment.

FIG. 3 is a diagram illustrating the detailed operation of the above described interleaving circuit 107. In FIG. 3, for blocks 1, 2, . . . comprising n bits after encoding, data of bits 1~n of the blocks after identical encoding are rearranged so as to be extremely far apart and formed into transmission code.

Next, the operation of the error correction encoder will be described. First of all, if information code is supplied to the class dividing circuit 101, it is sequentially discriminated from information having a high degree of importance into classes 0~2, according to previously set information degree of importance, and output for each class.

Here, information output as extremely important class 0 is supplied to the CRC calculating circuit 102 and the class 0 block coding circuit 103.

Error detection information (CRC code) is obtained from this class 0 information by the CRC calculating circuit 102, and the error detection information is supplied to the class 0 block coding circuit 103. Blocks of fixed k-bit units are formed from the error detection information and the information code by the class 0 block coding circuit 103, and at the same time, either the error detection information is centrally arranged in a single block, or the information code is dispersed and arranged in a plurality of blocks.

In this way, k-bit units of class 0 block data are supplied to the class 0 encoding circuit 104.

Class 0 block data are subjected to block coding at the class 0 encoding circuit 104, using, for example, NR code having a code length n=16 and number of information codes k=8, to append a correction capability for transmission path errors, and the class 0 block coded data are then supplied to the interleaving circuit 107.

On the other hand, class 1 information code output from the class dividing circuit 101 is formed into blocks of k-bit units by the class 1 block coding circuit 105, and supplied to the class 0 block coding circuit 103, and at the same time, the class 1 block coded data is supplied to the class 1 encoding circuit 106. This class 1 data is subject to block coding using the above mentioned non-linear NR code by the class 1 encoding circuit, and the class 1 block coded data is supplied to the interleaving circuit 107. In the interleaving circuit 107, the class 0 block coded data, the class 1 block data and the class 2 information code from the class dividing circuit 101 that has not been subject to error correction have their bits rearranged so that n bits constituting identical encoded blocks are mutually as far apart as possible in order to cause even errors that occur in bursts in a transmission path to be random errors for each code block. A bit string obtained by interleaving in this way is output as transmission code.

In the above described error correction encoder, error detection information is appended as class 0 data to the most important type of information code among the input information code, and at the same time error correction block coding is carried out using NR code. For class 1 information code that is the next important type after class 0, error detection block coding is carried out using NR code but without appending error detection code. For class 2 information code that is not as important as class 1, no error detection information is appended and error correction block coding is not carried out. These three types of data are then interleaved and transmission code is generated and transmitted to a receiver side decoder.

Accordingly, by constructing the error correction encoder as described above, extremely important class 0 information code can be transmitted even if it is transmitted using an inferior radio communication path, by applying sufficient counter-measures against transmission path errors. Also from the point of view of transmission efficiency, error detection information is appended to extremely important class 0 information code, but no error detection information is appended to the other class 1 and class 2 information code, and so there is no excessive lowering of the transmission efficiency.

Figure 4:
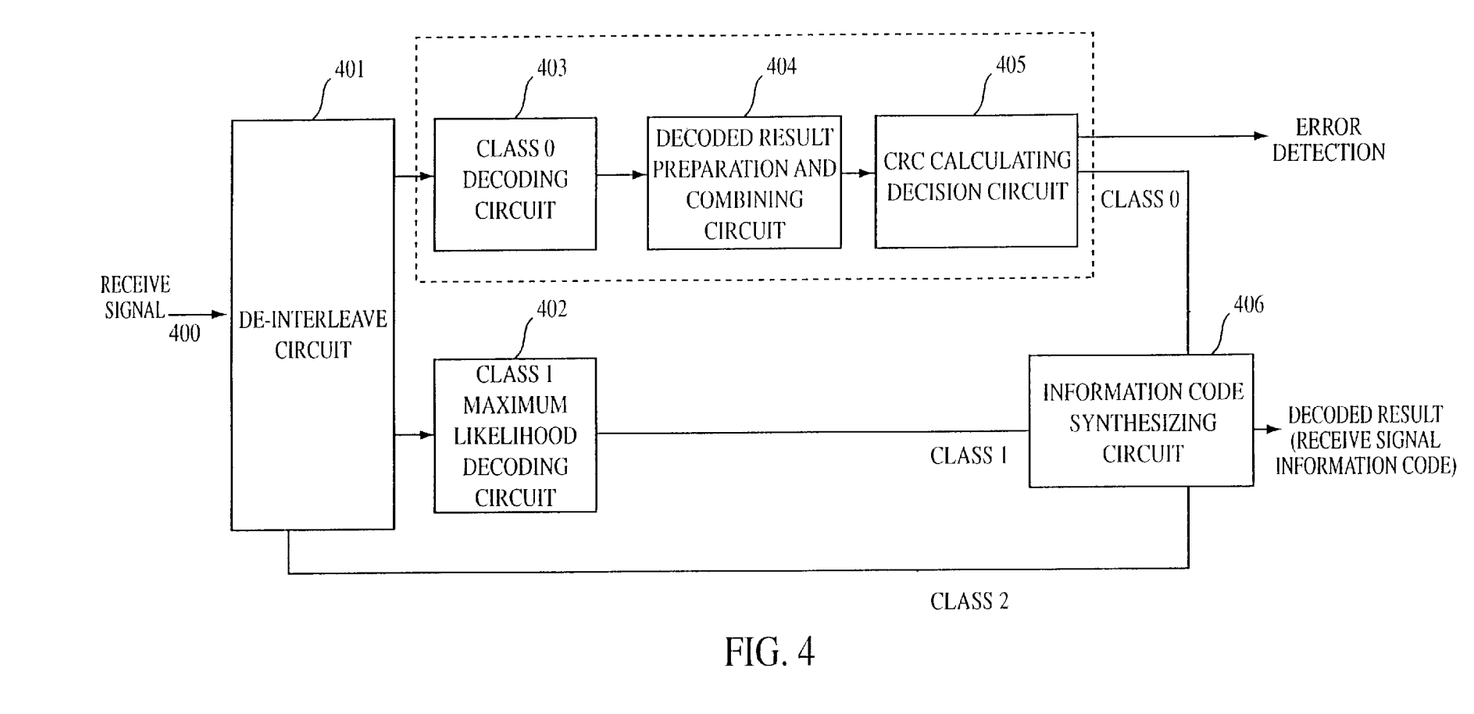
FIG. 4 is a functional block diagram of an error correction decoder of a first embodiment of the present invention.

FIG. 4 is a functional block diagram of a receive side error correction decoder of the first embodiment. In FIG. 4, the error correction decoder comprises a de-interleaving circuit 401, a class 0 decoded result preparation and combining circuit 404, a CRC calculator/decision circuit 405 and an information code synthesizing circuit 406. Next, the function of each of the above components will be described. When the deinterleaving circuit 401 takes in the transmission code supplied from the above described error correction encoder, the code is rearranged using an inverse processing method described above in FIG. 3, and class 0~class 2 transmission code is extracted for every n bits and output. The class 0 transmission code (16 bits×3 systems) is supplied to the class 0 decoding circuit 403, the class 1 transmission code is supplied to the class 1 maximum likelihood decoding circuit 402, and the class 2 transmission code is supplied directly to the information code synthesizing circuit 406 as it has not been error correction encoded.

The class 1 maximum likelihood decoding circuit 402 carries out maximum likelihood error correction decoding for class 1 receive code strings of n bit units supplied from the interleaving circuit 401, and regenerates and outputs class 1 information code and supplies it to the information code synthesizer 406. In this maximum likelihood error correction decoding, as a result of the fact that error correction encoding has been carried out at the transmission side using NR code, as one example, the maximum likelihood error correction decoding method described in the following publication 1 is preferably applied.

Publication 1: IEEE Transactions On Information Theory, Vol. IT-33, No. 6, November 1987, "Fast ML (Maximum Likelihood) Decoding Algorithm for the Nordstrom-Robinson Code".

The class 0 decoding circuit 403 carries out error correction decoding for class 0 receive code strings of n bit units (16 bits×3 system signals) in the same way as the above described class 1 maximum likelihood decoding circuit 402, but decoding up to final class 0 information code is not carried out in this class 0 decoding circuit 403 stage, and Npre candidates having a high degree of likelihood (for example, A0~A1, B0~B1, C0~C1) are respectively extracted for each system and supplied to the class 0 decode results combining circuit 404.

The class 0 decode result combining and preparation circuit 404 sequentially generates, for example, Npre×(N class 0+Ncrc)/k combined decode result candidate codes having a high degree of likelihood from Npre candidates having high degree of likelihood of the three systems supplied from the class 0 decoding circuit 403, and supplies them to the class 0 CRC calculating/comparison circuit 405.

The class 0 CRC calculating/decision circuit 405 carries out CRC checking in order of highest degree of likelihood for a plurality of combined decode result codes generated by the class 0 decode result combining and preparation circuit 404, and outputs combined decode result codes that have been determined as having no errors to the information code synthesizing circuit 406 as class 0 information code decode results, while on the other hand, when it is determined during the CRC check that there are errors for all code candidates, error detection information is output together with maximum likelihood decode results. The class 0 CRC calculation/decision circuit 405 may also partially include and output class 0 information other than class 0 information code.

The information code synthesizing circuit 406 regenerates information code by synthesizing class 0 information code from the class 0 CRC calculation/decision circuit 405, class 1 information code from the class 1 maximum likelihood decoding circuit 402 and class 2 information code supplied from the de-interleaving circuit 401, and uses them as receive information codes.

Figure 5:
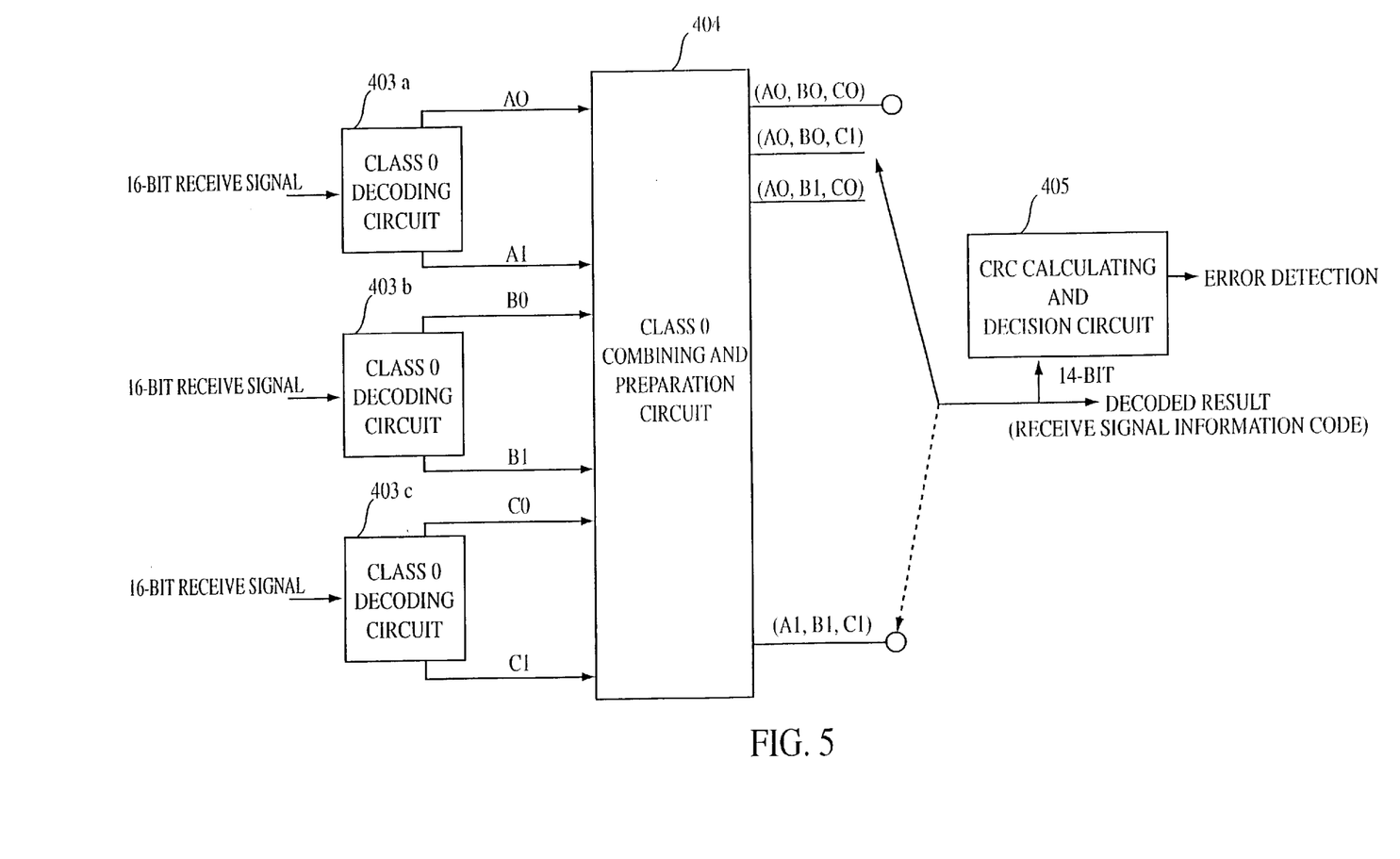
FIG. 5 is a detailed block diagram of decoding processing for class 0 data of the first embodiment.

Next, the class 0 error correction decoding circuit enclosed within the dotted line in FIG. 4 will be described in detail. FIG. 5 shows the detailed functional configuration of the class 0 decoding circuit 403, class 0 decode result combining and preparation circuit 404 and class 0 CRC calculation/decision circuit 405 enclosed within the dotted line of FIG. 4. In this description of FIG. 5, a description will be given of class 0 decoding processing assuming N class 0=14 bit information code, Ncrc=7 bit CRC code and Npre=2 high degree of likelihood candidates, and with code having a code length n=16, and a number of information symbols k=7.

In FIG. 5, 16-bit class 0 receive code strings are respectively taken in by class 0 decoding circuits 403a~403C, after deinterleaving. When a first 16-bit receive code string is taken in by the first class 0 decoding circuit 403a, maximum likelihood decoding is carried out using error correction and candidates A0 and A1 are extracted, and these candidates are supplied to the class 0 decode result combining and preparation circuit 404. When a second 16-bit receive code string is taken in by the second class 0 decoding circuit 403b, maximum likelihood decoding is carried out using error correction and candidates B0 and B1 are extracted, and these candidates are supplied to the class 0 decode result combining and preparation circuit 404.

When a third 16-bit receive code string is taken in by the third class 0 decoding circuit 403c, maximum likelihood decoding is carried out using error correction candidates C0 and C1 are extracted, and these candidates are supplied to the class 0 decode result combining and preparation circuit 404.

Namely, A0, B0 and C0 are the highest degree of likelihood decode candidates, and A1, B1 and C1 are the least degree of likelihood decode candidates.

The 7 bit decode candidates extracted by the first class 0 decoding circuit 403a to the third class 0 decode circuit 403c are combined by the class 0 decode result combining and preparation circuit 404 and decode results combined in order of highest degree of likelihood (A0, B0, C0) are output, while at the same time it is also determined by the class 0 CRC calculation/decision circuit 405 whether or not there are errors, and if there are no errors the combined decode results are output as final decode results, namely, as receive information code. This decision is carried out for all of the remaining decode results combined in order of highest degree of likelihood (A0, B0, C0), (A0, B0, C1), . . . , (A1, B1, C1), and the results of CRC calculations/decisions are output. Also, combined decode results for which it has been determined that there are errors are subjected to discarding processing.

Next, the operation of the above described receive side error correction decoder will be described. First of all, if the transmission code from the transmission side error correction encoder is supplied to the de-interleaving circuit 401 it is subjected to bit rearrangement processing reverse to that of the transmission side interleaving circuit 107, and receive code strings are output for separate classes. Class 0 receive code strings are supplied to the class 0 decoding circuit 403, class 1 receive code strings are supplied to the class 1 maximum likelihood decoding circuit 402 and class 2 receive code strings are directly supplied to the information code synthesizing circuit 406 without decoding.

Class 0 receive code strings are supplied for the class 0 decode circuit 403 as, for example, using three 16 bit code strings, and decoding for error correction block encoded data as carried out using NR code by this circuit 403, and high degree of likelihood Npre candidates for each system (for example, A0~A1, B0~B1, C0~C1) are respectively extracted and supplied to the class 0 decode result combining and preparation circuit 404. Extracted high degree of likelihood Npre decode candidates are formed into combined candidates in the class 0 decode result combining and preparation circuit 404, and Npre (N class 0+Ncrc)/k combined decode result candidate codes (for example, (A0, B0, C0), (A0, B0, C1), . . . ,)) are output in order of highest degree of likelihood.

These decode result candidates are subject to CRC checking in the order of highest degree of likelihood by the class 0 CRC calculation/decision circuit 405, and combined decode result codes for which it has been determined that there are no errors are output as class 0 final decode result information code and supplied to the information code synthesizing circuit 406. On the other hand, in the event that it is determined that there are errors in the CRC check, error detection information is output at the same time that the above described maximum likelihood decode result candidates are directly output, and supplied to the information code synthesizing circuit 406.

Class 1 receive information strings output from the de-interleaving circuit 401 are subject to maximum likelihood error correction decoding for block encoded data by the class 1 maximum likelihood decoding circuit 402, and the decoded result is supplied as class 1 information code to the information code synthesizing circuit 406. Class 0~class 2 information code obtained by detection or decoding is synthesized by the information code synthesizing circuit 406 and output as receive information code of one system, namely as receive decode result information code.

As described above, error correction block decoding is carried out in the error correction decoder for NR code for the class 0 data among the receive code that has code of an extremely important type, and a plurality of decode candidates are obtained. Combined decode result candidates are produced for these decode candidates, and correct class 0 decode result candidate codes strings are obtained using error decision, while at the same time class 1 information code is obtained by carrying out maximum likelihood decoding for class 1 receive code strings. Finally, information code strings for one system are decoded and output by synthesizing class 2 information code strings and class 0 and class 1 information code strings, and if errors are detected in the class 0 decode results error detection information is output.

Accordingly, by constructing the decoder as described above, extremely important class 0 information code exhibits sufficient error correction efficiency with respect to transmission path errors, even when transmitted via a radio communication path of inferior quality. Even from the point of view of transmission efficiency, transmission is carried out by appending error detection information to extremely important class 0 information code, but error correction information is not appended to the other class 1 and class 2 information code, and so there is no significant lowering of the transmission efficiency.

The first embodiment has the following effects. Namely, in a transmission path that is inferior from the point of view of radio communication, transmission errors arise that exceed the error correction capability of the error correction code. Even in a situation where error correction could not be carried out with results decoded using a conventional maximum likelihoods decoding circuit, by adopting the above described construction a few decode result candidates are left as a result of decode processing for extremely important class 0 information code, and the decode error rate is lowered as a result of selecting preferable decode results using results of error detection, and so it is possible to carry out data transmission with higher reliability.

Further, the error correction code used at the time of encoding is a parameter requested initially by the receive side decoder in order to confirm the reliability of the receive data, and is not a novel addition in the present invention, and so there is no redundancy code increase.

Second Embodiment

The second embodiment will be described as a case where the error correction encoder and error correction decoder disclosed in the first embodiment above are applied to a TDMA (Time Division Multiple Access) digital cellular communications system portable terminal.

Figure 6:
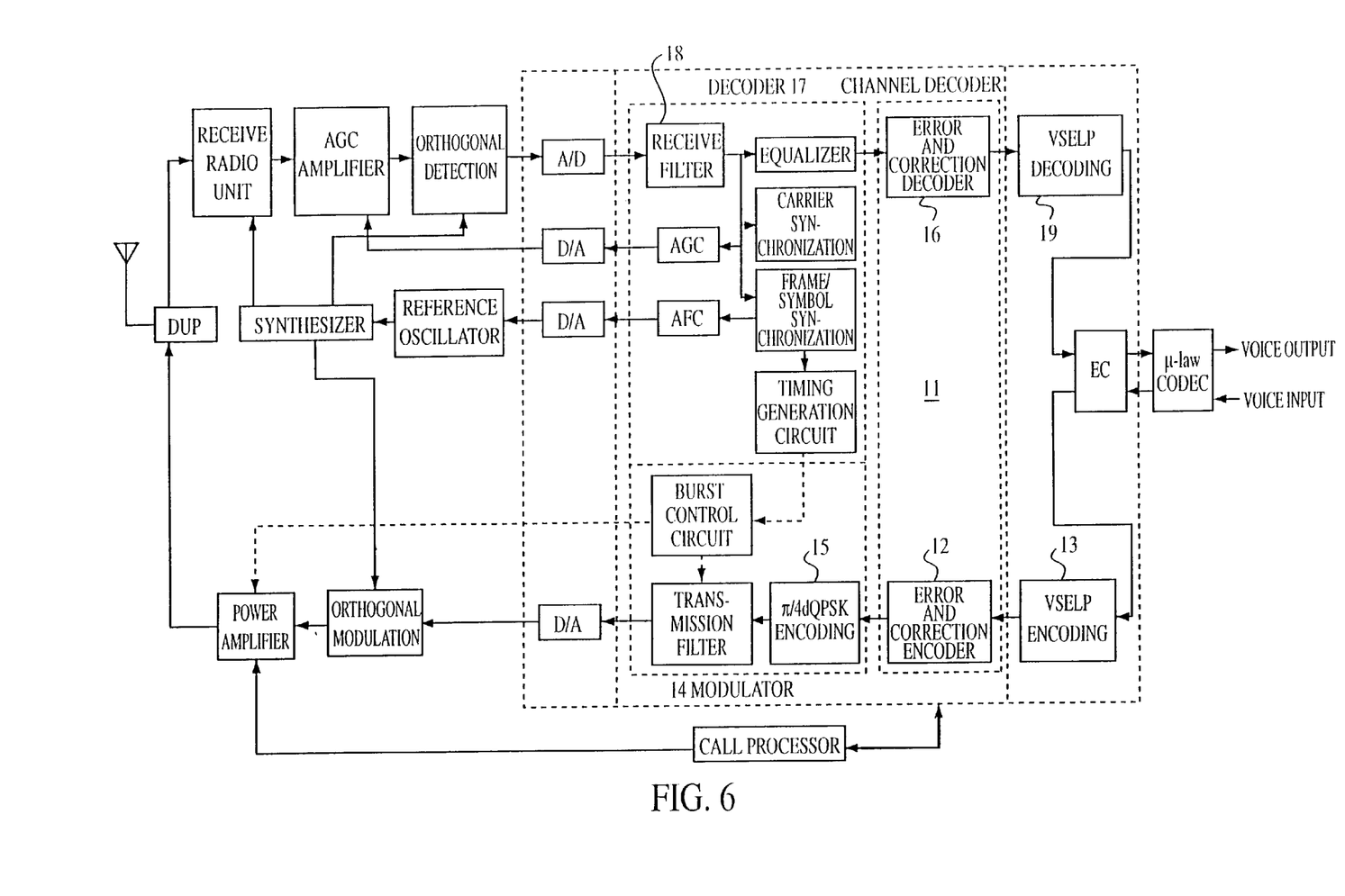
FIG. 6 is a functional block diagram of a TDMA digital cellular portable terminal of a second embodiment of the present invention.

FIG. 6 is a functional block diagram of a TDMA digital cellular portable terminal. In FIG. 6, by applying the encoder disclosed in the above described first embodiment (FIG. 1) to an error correction encoding circuit 12 of a channel CODEC 11, encoded data from a VSELP encoding circuit 13 is taken in, class divided and subjected to error correction encoding, and supplied to a$\pi$/4 DQPSK encoding circuit 15 of a modulator 14. DQPSK is an abbreviation for Differential Quadrature Phase-Shift Keying.

On the other hand, by applying the decoder disclosed in the above described first embodiment (FIG. 4) to an error correction decoding circuit 16 of a channel CODEC 11, error correction is carried out for an output signal from the equalizer 18 of the demodulator 17, and supplied to a VSELP decoding circuit 19.

Figure 7:
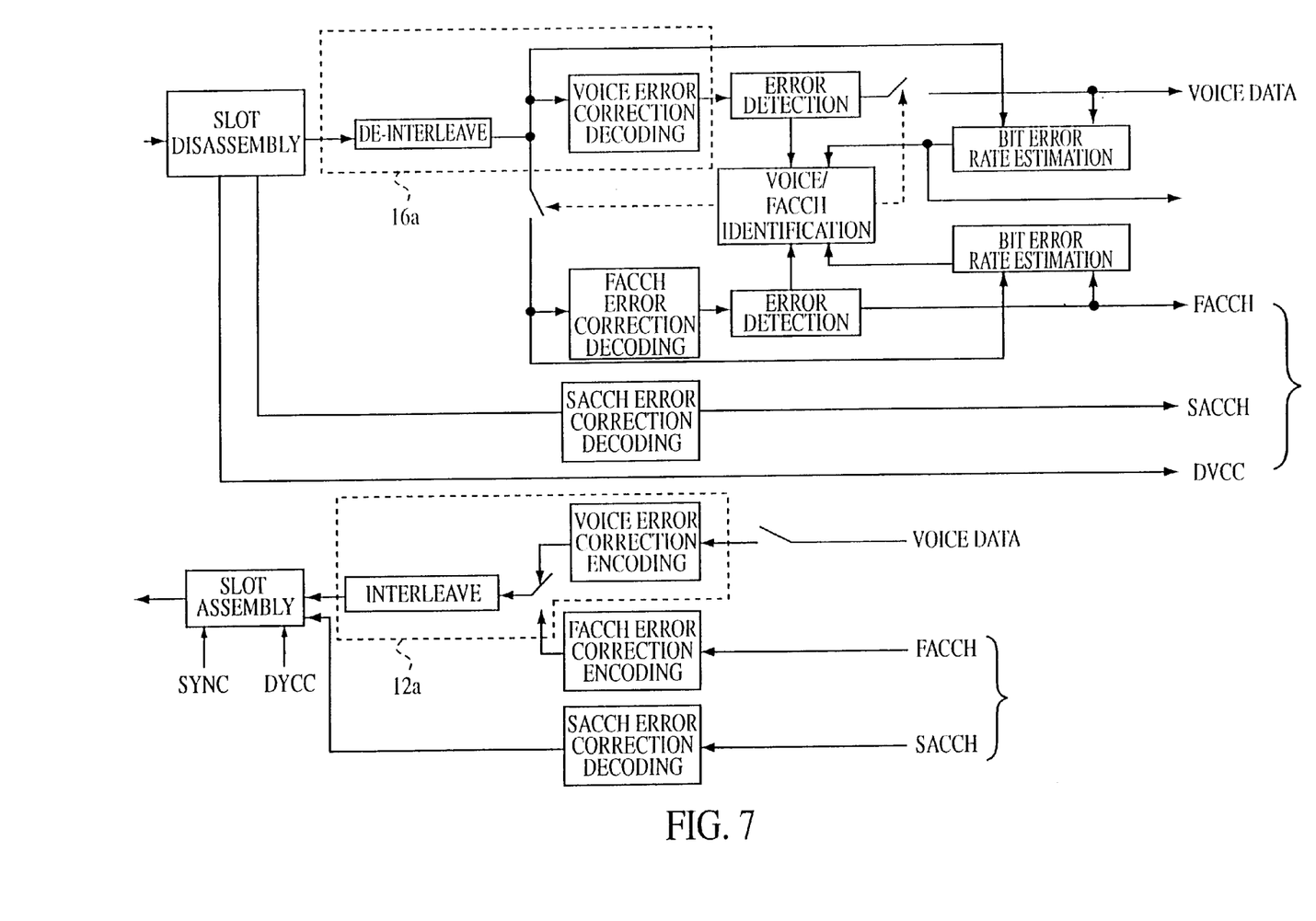
FIG. 7 is a functional block diagram of a channel CODEC of the TDMA digital cellular portable terminal of the second embodiment.

FIG. 7 is a more detailed functional block diagram of the above described channel CODEC 11. In FIG. 7, error correction is carried out for voice encoded data using the circuit 12a enclosed within a dotted line, and further, error correction decoding is carried out for receive code strings using the circuit 16a enclosed by a dotted line, and voice data are output.

The effects of the second embodiment are as follows. According to the above described second embodiment, the effects of the encoder and decoder of the first embodiment can be obtained, while at the same time it is possible to considerably improve the reception quality of voice data for a TDMA digital cellular portable terminal. In FIG. 6 and FIG. 7, a description has been given for an example applied to a portable terminal, but obviously it can also be similarly applied to a base station system associated with a portable terminal.

Third Embodiment

The third embodiment will be described as an example in which the encoder and decoder of the first embodiment are applied as the transmitter and receiver of a CDMA (Code Division Multiple access) system.

Figure 8:
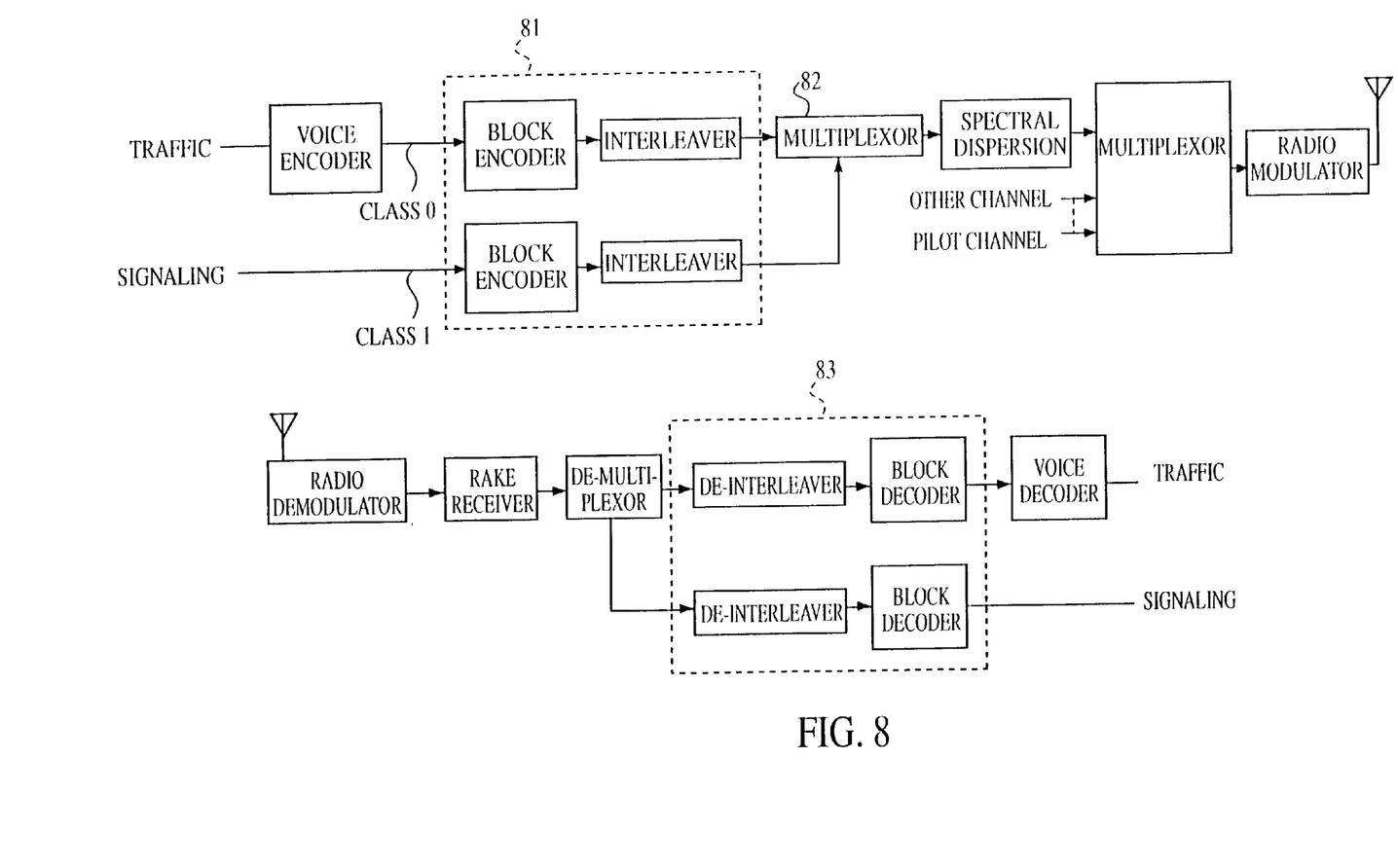
FIG. 8 is a functional block diagram of a base station for forward linking of a CDMA communication system of a third embodiment of the present invention.

FIG. 8 is a drawing for explaining an example in which the encoder and decoder of the first embodiment are applied as the transmitter and receiver of a forward link base station system from a base station to a mobile station. In FIG. 8, by applying the encoder of the above described first embodiment to the circuit 81 enclosed within the dotted line of the transmitter, that part of a traffic signal that is information of high priority (or information of high importance) is error correction encoded as class 0 data, and a signalling signal is error correction encoded as class 1 data, and supplied to a multiplexor 82. Further, by applying the decoder of the above described decoder to the circuit 83 enclosed within the dotted line in the receiver, it is possible to considerably improve the receive signal quality of a traffic signal (for example, voice data) obtained as a result of error correction decoding.

Figure 9:
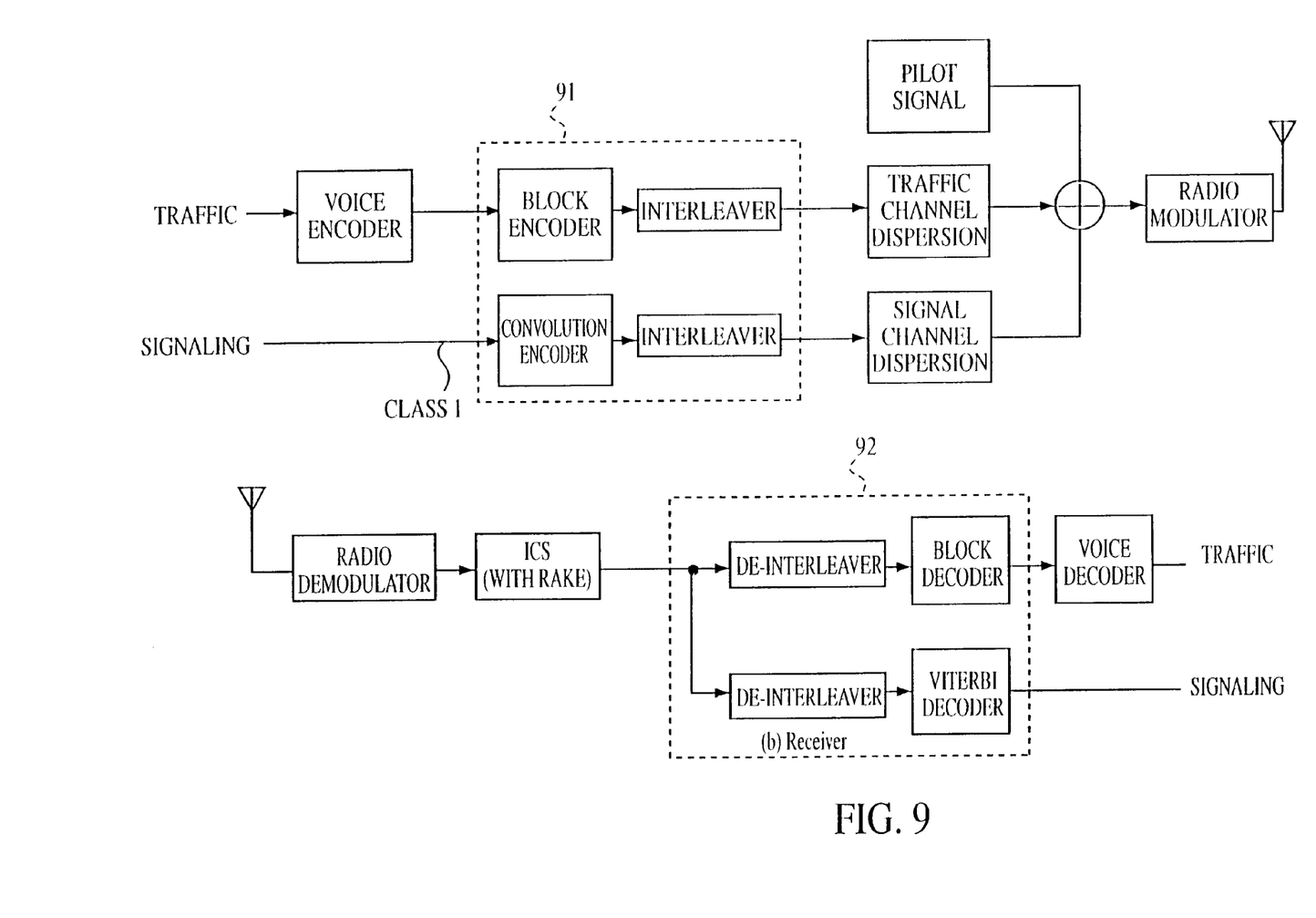
FIG. 9 is a functional block diagram of a mobile station for reverse linking of a CDMA communication system of a third embodiment.

FIG. 9 is a drawing for describing an example where the encoder and decoder of the above described first embodiment are applied to a transmitter and receiver of a reverse link base station system from a mobile station to a base station. In FIG. 9, by applying the above described encoder of the first embodiment to the circuit 91 enclosed within the dotted line in the transmitter, a traffic signal is error correction block coded as class 0 data, and a signalling signal is convolution encoded as class 1 data. Further, by applying the decoder of the above described first embodiment to the circuit 92 enclosed within the dotted line of the receiver, the reception quality of a traffic signal (for example, voice data) obtained by error correction block decoding can be considerably improved.

According to this third embodiment, it is possible to realize the same effects as the encoder and decoder of the above described first embodiment, as well as making it possible to considerably improve the reception quality of a traffic signal (for example, voice data) for a CDMA communication system base station or mobile station.

Other Embodiments

1. In the above embodiments, error correction for class 0 was preferably carried out using expansion preparation encoding as block encoding and a modified example of NR encoding. For this method, it is preferable to apply, for example, "Complex Error Correction Encoding using expansion preparation encoding" disclosed in Miscellaneous papers of the Electronic information Communication Society, Vol 1, J75A, No. 8, Page 1250–1256, August 1992.

Further, the above described NR code, expansion preparation code, etc. are non linear codes, but it is also possible to use other codes such as Paciliev Scheinheim code, Nadler code, Green code, etc. as this non linear code. For example, for random error correction, BCH (Bose-Chaudhuri-Hocquenghem) code, majority decision logic code, etc. are preferred. Also, as code preferred for burst error correction, there are ReedSolomon code, fire code etc.

2. It is also desirable to have a configuration such that block encoding is also carried out using error correction for class 2 information code. Briefly, in the present invention, extremely important information is block encoded and further has error correction information appended thereto, and is characterized by carrying out block encoding for the purpose of error correction for the block encoded data using linear code or non linear code. For information code within the device other than extremely important information code, various encoding methods can be applied as long as the transmission efficiency is not significantly reduced.

3. Error detection information is appended and block encoding carried out for class 0 information code, but it is also possible to provide a configuration where error correction information is appended to class 1 and class 2 information and convolution encoding (for example Trellis encoding) is carried out.

4. In the first embodiment, power information and LPC coefficients (voice path coefficients) etc. are set to class 0 as the most important information, but as other examples, class 0 in extremely important information can be set to partial information of a voice signal, and as other information control information etc. can be set to class 1. Also, information having an extremely high level of priority, for example, information that has high urgency or immediacy, can be set as class 0.

Industrial Field of Utilization

The error correction encoder of the present invention comprises input information extraction means for extracting and outputting extremely important information or input information having an extremely high level of priority, from within input information that is to be subject to error correction encoding, and error correction encoding means for obtaining error detection information for every specified bit length of input information extracted by the input information extraction means, and combining the error detection information and input information of a specified bit length to form a block, carrying out encoding processing using error correction code for block data obtained from the block formation and outputting error correction encoding data.

The error correction decoder of the present invention comprises decode candidate estimating means for carrying out error correction decoding processing from error correction encoding data for every block from the error correction encoder of claim 1, and estimating at least two decode candidate data estimated as appearing extremely reliable according to error correction decoding processing for error correction encoding data of at least one block, and valid decode candidate determining means for deciding whether or not there is an error by carrying out error inspection for combined decode candidate data formed by combining these decode candidates estimated as appearing reliable, and determining decode candidate data without errors as valid decode data for output.

By adopting the above described construction, it is possible to realize an error correction encoder, error correction decoder and communication system having improved error detection and error correction capabilities with respect to extremely important information and signal transmission, compared with the conventional art, without lowering the transmission efficiency.

We claim:

1. An error correction encoder, comprising:
   a calculating circuit to calculate and generate error detection information having a specified bit length, based on an input data string; and
   error correction encoding means to form plural data blocks from bits of the input data string and bits of the error detection information, to apply error correction code to each of the plural data blocks, and to generate error correction encoded data.

2. The error correction encoder claimed in claim 1, wherein each of the plural data blocks includes bits of the input data string and bits of the error detection information.

3. The error correction encoder claimed in claim 1, wherein one of the plural data blocks includes all the bits of the error detection information.

4. An error correction encoder, comprising:
   input information classification means for classifying different categories of input information into a plurality of classifications according to a degree of importance of the category of input information, and for separately generating most important information and second-most important information;

a calculating circuit to calculate and generate error detection information having a specified bit length based on the most important information;

first error correction encoding means to form plural first data blocks having a specified bit length, using bits of the most important information and bits of the error detection information, to apply first error correction code to each of the plural first data blocks, and to generate first error correction encoded data; and second error correction encoding means to form plural second data blocks having a specified bit length using bits of the second-most important information, to apply second error correction code to each of the plural second data. blocks, and to generate second error correction encoded data.

5. The error correction encoder claimed in claim 4, further comprising:

interleave means to interleave the first error correction encoded data and the second error correction encoded data, and to generate an interleaved result.

6. The error correction encoder claimed in claim 4, wherein:

the input information classification means classifies one of voice path coefficients and power information of the input information as the most important information.

7. The error correction encoder claimed in claim 4, wherein the first error correction encoding means further uses bits of the second-most important information to form the plural first data blocks.

8. The error correction encoder claimed in claim 4, wherein the input information classification means further separately generates least important information.

9. The error correction encoder claimed in claim 8, further comprising:

interleave means to interleave the first error correction encoded data, the second error correction encoded data, and the least important information, and to generate an interleaved result.

10. The error correction encoder claimed in claim 4, wherein the second error correction encoding means forms the plural second data blocks using only the bits of the second-most important information.

11. A communication system comprising an error correction encoder and an error correction decoder, wherein:

the error correction encoder comprises:

a calculating circuit to calculate and generate error detection information having a specified bit length based on an input data string; and error correction encoding means to form plural data blocks from bits of the input data string and bits of the error detection information, to apply error correction code to each of the plural data blocks, and to generate plural groupings of error correction encoded data; and the error correction decoder comprises:

decode candidate estimating means for carrying out error correction decoding processing for each of said plural groupings of error correction encoded data, and estimating at least two decode data candidates for each of the plural groupings of error correction encoded data; and valid decode candidate determining means for combining the decode data candidates for each of the plural groupings of error correction encoded data to form plural combinations of decode data candidates, determining whether each combination of decode data candidates has an error, and designating any combination of decode data candidates that has no error as being valid data corresponding to the input data string.

* * * * *